United States Patent [19]

Barre

[11] Patent Number: 4,517,476

[45] Date of Patent: May 14, 1985

[54] ECL GATE HAVING EMITTER BIAS CURRENT SWITCHED BY INPUT SIGNAL

[75] Inventor: Claude Barre, Munich, Fed. Rep. of Germany

[73] Assignee: Siemens Aktiengesellschaft, Berlin and Munich, Fed. Rep. of Germany

[21] Appl. No.: 488,991

[22] Filed: Apr. 26, 1983

[30] Foreign Application Priority Data

Apr. 26, 1982 [DE] Fed. Rep. of Germany ....... 3215518

[51] Int. Cl.$^3$ ................. H03K 19/086; H03K 19/003
[52] U.S. Cl. ............................ 307/455; 307/296 A
[58] Field of Search ........................... 307/454–455, 307/467, 494, 296 A, 297; 330/259, 261, 290, 296, 127, 136

[56] References Cited

U.S. PATENT DOCUMENTS

| | | | |
|---|---|---|---|
| 3,909,636 | 9/1975 | Masaki et al. | 307/455 |
| 3,955,099 | 5/1976 | Gaskill, Jr. et al. | 307/455 |
| 4,100,431 | 7/1978 | Stipanuk | 307/297 X |
| 4,349,750 | 9/1982 | Geurts | 307/455 X |
| 4,435,654 | 3/1984 | Koide | 307/455 |
| 4,439,696 | 3/1984 | Yokoya | 307/494 |

FOREIGN PATENT DOCUMENTS 46681  4/1980  Japan ................................ 307/455

OTHER PUBLICATIONS

Abilevitz, B. et al., "ECL Receiver for Schottky Current Switch Circuit", IBM Technical Disclosure Bulletin, vol. 21, No. 4, Sep. 1978, pp. 1451–1452.

Primary Examiner—Stanley D. Miller
Assistant Examiner—D. R. Hudspeth
Attorney, Agent, or Firm—Hill, Van Santen, Steadman & Simpson

[57] ABSTRACT

Given a logic element in ECL or E$^2$CL technology whose differential amplifier is driven by way of an emitter follower, a transistor is inserted between the emitter-side terminal of the supply voltage and the constant current source for the feed of the differential amplifier, the additional transistor being controlled by the current through the emitter resistor of the emitter follower transistor. With this structure, the absence of or too low a value of the emitter follower current can be perceived during a static check.

9 Claims, 3 Drawing Figures

ECL GATE HAVING EMITTER BIAS CURRENT SWITCHED BY INPUT SIGNAL

BACKGROUND OF THE INVENTION

1. Field of the Invention

The present invention relates to a logic element constructed in accordance with current transfer technology having an emitter follower or, respectively, a plurality of emitter followers connected in parallel, as an input circuit and having at least one differential amplifier fed from a constant current source and comprising emitter-coupled transistors which are alternately blocked or rendered conductive.

2. Description of the Prior Art

Logic elements of the type set forth above are generally known in the art and are designated ECL and $E^2CL$ logic circuits (cf. "Der Fernmelde-Ingenieur", No. 7, July 1973, pp. 20-21, particularly FIGS. 13 and 14, fully incorporated herein by this reference). Whereas emitter followers for the purpose of signal level shift precede the control inputs of the differential amplifiers, typical of the emitter-coupled logic in ECL circuits only in conjunction with so-called series coupling, a plurality of emitter followers are frequently connected in parallel in $E^2CL$ circuits and are provided with a common emitter resistor. In addition to a signal level shift, the emitter followers then effect the inclusive-OR operation of a corresponding plurality of input signals. An exemplary embodiment of such a circuit is illustrated in FIG. 1.

A differential amplifier having the emitter-coupled transistors T1 and T2 and the collector load resistors R1 and R2 is fed with a constant current $I_D$ which is stabilized by a constant current source consisting of a transistor T3 and an emitter resistor R3. The base of the constant current transistor T3 is connected to a first fixed potential VR1. The base of the transistor R1 of the differential amplifier is fixed by a second fixed reference potential VR2. The output signals Q and $\overline{Q}$ can be tapped at the junctions of the load resistors R1 and R2 with the collectors of the transistors T1 and T2 of the differential amplifier.

The aforementioned emitter follower typical of $E^2CL$ logic elements for driving the base of the second transistor T2 of the differential amplifier consists of the transistor T4 and the emitter load resistor R4. An input signal E is applied to the base of the emitter follower transistor T4.

Given the series connection of a plurality of logic elements in current mode logic technology, ECL elements and $E^2CL$ elements no longer differ in terms of the sequence of emitter follower and differential amplifier. A distinguishing criterion which is of no further interest in the present context, however, at most consists in the realization of inclusive-OR operations.

By way of addition, it should be pointed out that a high value resistor in comparison to the collector load resistors R1, R2 is frequently employed for the differential amplifier instead of a constant current source consisting of a transistor and an emitter resistor. On the other hand, the ohmic emitter resistor R4 in the emitter follower is occasionally replaced by a constant current source.

A current $I_E$ which has the direction for npn transistors, referenced in FIG. 1 by an arrow, is required for the discharge of the parasitic capacitance of the node A (FIG. 1) given a decreasing signal edge at the input E. When this bias current $I_E$ is absent due to an error in the manufacture of an integrated module, for example due to an interruption of the connecting lines to the emitter resistor R4, or if it has greatly reduced in comparison to the rated value, then the same can lead to a prolongation of the transfer of the output signals Q or, respectively, $\overline{Q}$ from one to the other binary signal level produced by a trailing edge of the input signal E which is increased by a factor of 100 and more without the fault being perceived in a static test because a differential amplifier just barely reacts correctly. The consequence is the necessity of introducing a high-cost dynamic check or the acceptance of the risk of a dynamic misbehavior of the circuit which has only been partially tested.

SUMMARY OF THE INVENTION

The object of the present invention is to alter the known circuit arrangement given negligible added expense and upon retention of all dynamic properties such that errors of the aforementioned type are sure to be perceived on the basis of the purely static check.

The above object is achieved, according to the present invention, in a logic element of the type initially mentioned, which is characterized in that the collector-emitter path of a further transistor, which is saturated in the standard condition, is inserted between the emitter-side terminal of the supply voltage and the constant current source, the base electrode of the further transistor being connected to the emitter of the transistor operated as an emitter follower or, respectively, to the emitters of the transistors operated as emitter followers over a connection device, for the purpose of generating and at least approximately constant bias current for the emitter follower or, respectively, for the emitter followers.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
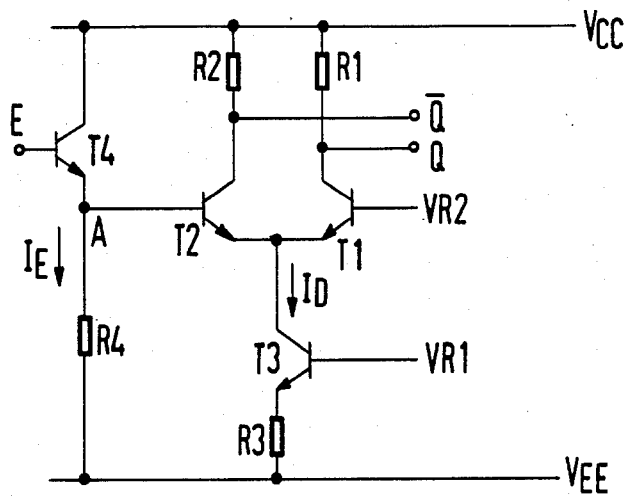
FIG. 1 is a schematic circuit diagram of a prior art logic circuit.

The prior arrangement of FIG. 1 has already been discussed above and will not be treated further.

Figure 2:
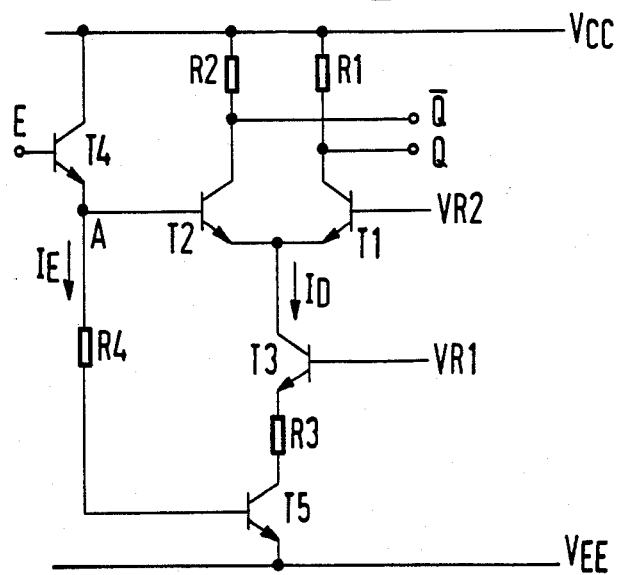
FIG. 2 is a schematic circuit diagram of an exemplary embodiment of the invention which utilizes, the same reference characters as employed for identical components of the known prior arrangement of FIG. 1.
Figure 3:
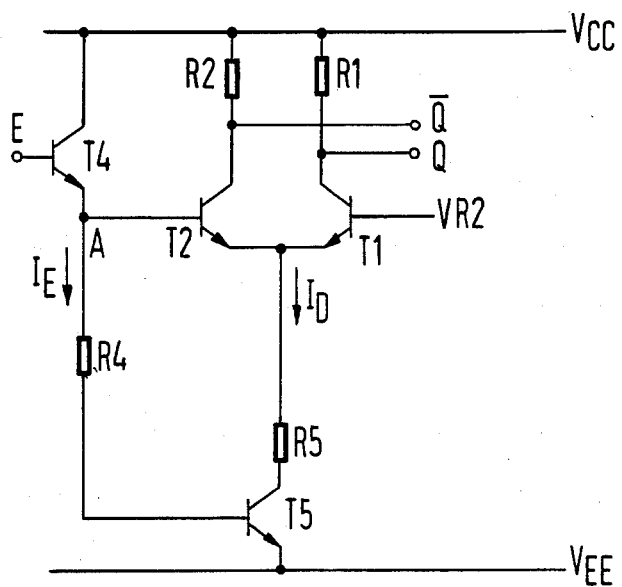
FIG. 3 is a schematic circuit diagram of another exemplary embodiment of the invention which utilizes, the same reference characters as employed for identical components of the known prior arrangement of FIG. 1.

Referring to FIG. 2, an embodiment of the invention is illustrated in which the collector-emitter path of an additional transistor T5 is connected between the constant current source for feeding the differential amplifier, namely the transistor T3 and its emitter resistor R3 or, respectively, the resistor R5 of FIG. 3, and the terminal $V_{EE}$ of the supply voltage at the emitter side. The terminal of the emitter resistor R4 not connected to the emitter follower transistor T4 is connected to the base of the additional transistor T5. By a corresponding selection of the emitter resistor R4 or, respectively, by dimensioning the constant current source replacing the same, the current $I_E$ barely drives the additional transistor T5 in the saturation range in the standard case.

When, due to a fault, the bias current $I_E$ is significantly smaller than its rated value or if it is entirely absent, the same is reflected by a reduction or the elimination of the voltage drop which, as a function of the input signal E, would occur at one of the load resistors R1 or R2 and which would have to reach a predetermined rated value. The same symptoms occur when, due to a manufacturing error, the input E is opened.

A significant advantage of a circuit arrangement constructed in accordance with the present invention can also be seen in that an unused differential amplifier having a preceding emitter follower whose input E is intentionally not connected does not dissipate power. Such instances occur with particular frequency in programmable logic units.

Although I have described my invention by reference to a particular illustrative embodiment thereof, many changes and modifications thereof may become apparent to those skilled in the art without departing from the spirit and scope of the invention. I therefore intend to include within the patent warranted hereon all such changes and modifications as may reasonably and properly be included within the scope of my contribution to the art.

I claim:

1. In a current mode logic element of the type in which a differential amplifier includes a pair of emitter-coupled transistors whose collectors are connected via respective resistors to a first voltage supply potential, whose emitters are connected via a constant current source to a second voltage supply potential, each of the transistors having a base, one of the bases serving as an input and the other connected to a reference potential, and in which at least one transistor operated as an emitter follower is connected between the first and second voltage supply potentials and includes a base for receiving logic signals and an emitter connected to the input base of the differential amplifier, the improvement therein comprising:
   an additional transistor including a collector-emitter path connected between the constant current source and the second voltage supply potential, and a base; and
   means connecting said base of said additional transistor to said emitter of said emitter follower transistor,
   whereby an approximately constant bias current is generated for the emitter follower transistor.

2. The improved logic element of claim 1, wherein: said means comprises a resistor.

3. In a current mode logic element of the type in which a differential amplifier which is connected to a first voltage supply potential and, via a constant current source, to a second voltage supply potential, and includes a first input for receiving logic signals and a second input connected to a reference potential, and in which at least one transistor operated as an emitter follower is connected between the first and second voltage supply potentials and includes a base for receiving logic signals and an emitter connected to the first input of the differential amplifier, the improvement therein comprising:
   an additional transistor including a collector-emitter path connected between the constant current source and the second voltage supply potential, and a base; and
   means connecting said base of said additional transistor to said emitter of said emitter follower transistor,
   whereby an approximately constant bias current is generated for the emitter follower transistor.

4. The improved logic element of claim 3, wherein: said means comprises a resistor.

5. A current mode logic element comprising:
   first and second differential amplifier transistors each including a base, an emitter and a collector, said emitters connected to one another, said base of said first transistor serving as an input base, and said base of said second transistor connected to a first reference potential;
   first and second resistors respectively connecting said collectors to a first voltage supply potential;
   a constant current source connected to said emitters;
   at least one input emitter follower comprising a third transistor including a collector connected to the first voltage supply potential, a base for receiving logic signals, and an emitter connected to said input base;
   a fourth transistor including a collector connected to said constant current source, an emitter connected to the second voltage supply potential, and a base; and
   bias means connected between said base of said fourth transistor and said emitter of said third transistor and providing an approximately constant bias current for said emitter of said third transistor.

6. The current mode logic element of claim 5, wherein:
   said constant current source comprises a resistor.

7. The current mode logic element of claim 5, wherein:
   said constant current source comprises
      a fifth transistor including a base, a collector and an emitter, and
      a third resistor,
   said base connected to a second reference potential,
   said collector connected to said emitters of said first and second transistors,
   said emitter connected to said collector of said fourth transistor via said third resistor.

8. The current mode logic element of claim 5, wherein:
   said bias means comprises a resistor having a value selected to provide said bias current for said emitter of said third transistor.

9. A current mode logic element comprising:
   first and second differential amplifier transistors each including a base, an emitter and a collector, said emitters connected to one another, and said base of said second transistor connected to a first reference potential;
   first and second resistors respectively connecting said collectors to a first voltage supply potential;
   a constant current source connected to said emitters;
   at least one input emitter follower comprising a third transistor including a collector connected to the first voltage supply potential, a base for receiving logic signals, and an emitter connected to said input base;

a fourth transistor including a collector connected to said constant current source, an emitter connected to the second voltage supply potential, and a base; and bias means connected between said base of said fourth transistor and said emitter of said third transistor and providing an approximately constant bias current for said emitter of said third transistor, said constant current source comprising
- a fifth transistor including a base, a collector and an emitter, and
- a third resistor,
- said base connected to a second reference potential,
- said collector connected to said emitters of said first and second transistors,
- said emitter connected to said collector of said fourth transistor via said third resistor, and said bias means comprising
- a resistor having a value selected to provide said bias current for said emitter of said third transistor.

* * * * *